(12) United States Patent
Rezende

(10) Patent No.: US 7,915,717 B2
(45) Date of Patent: Mar. 29, 2011

(54) PLASTIC IMAGE SENSOR PACKAGING FOR IMAGE SENSORS

(75) Inventor: Carlos F. Rezende, Henrietta, NY (US)

(73) Assignee: Eastman Kodak Company, Rochester, NY (US)

( * ) Notice: Subject to any disclaimer, the term of this patent is extended or adjusted under 35 U.S.C. 154(b) by 157 days.

(21) Appl. No.: 12/193,216

(22) Filed: Aug. 18, 2008

(65) Prior Publication Data

US 2010/0038737 A1 Feb. 18, 2010

(51) Int. Cl.
*H01L 23/02* (2006.01)

(52) U.S. Cl. ........ 257/667; 257/680; 257/704; 257/774; 257/E31.118; 257/E31.128

(58) Field of Classification Search .......... 257/678–795, 257/E21.499, E23.019–23.066, E31.118, 257/433, 667–774, 128
See application file for complete search history.

(56) References Cited

U.S. PATENT DOCUMENTS

| | | | |
|---|---|---|---|
| 4,663,833 A | 5/1987 | Tanaka et al. | |
| 4,971,930 A | 11/1990 | Fusaroli et al. | |
| 5,070,041 A * | 12/1991 | Katayama et al. | 29/827 |
| 5,164,831 A | 11/1992 | Kuchta et al. | |
| 5,382,310 A * | 1/1995 | Ozimek et al. | 156/275.5 |
| 5,811,799 A * | 9/1998 | Wu | 250/239 |
| 5,865,935 A * | 2/1999 | Ozimek et al. | 156/303.1 |
| 6,037,655 A * | 3/2000 | Philbrick et al. | 257/680 |
| 6,121,675 A * | 9/2000 | Fukamura et al. | 257/680 |
| 6,184,514 B1 * | 2/2001 | Rezende et al. | 250/208.1 |
| 6,291,263 B1 * | 9/2001 | Huang | 438/106 |
| 6,384,472 B1 * | 5/2002 | Huang | 257/680 |
| 6,693,674 B1 | 2/2004 | Wataya et al. | |
| 6,740,870 B1 * | 5/2004 | Doudoumopoulos | 250/239 |
| 6,753,922 B1 * | 6/2004 | Sengupta et al. | 348/374 |
| 6,803,651 B1 * | 10/2004 | Chiang | 257/698 |
| 6,808,960 B2 * | 10/2004 | Yamamoto | 438/107 |
| 6,837,431 B2 * | 1/2005 | Carlson et al. | 235/454 |
| 6,864,564 B2 * | 3/2005 | Ke et al. | 257/666 |
| 7,026,707 B2 * | 4/2006 | Li et al. | 257/678 |
| 7,189,954 B2 * | 3/2007 | Farnworth et al. | 250/208.1 |
| 7,473,889 B2 * | 1/2009 | Lye et al. | 250/239 |
| 7,531,785 B2 * | 5/2009 | Inoguchi | 250/214.1 |
| 7,645,635 B2 * | 1/2010 | Wood et al. | 438/113 |
| 2002/0060358 A1 * | 5/2002 | Hung et al. | 257/678 |
| 2003/0057426 A1 | 3/2003 | Miyazaki et al. | |
| 2004/0070076 A1 * | 4/2004 | Hayashimoto et al. | 257/749 |
| 2004/0165356 A1 | 8/2004 | Mun et al. | |
| 2005/0099532 A1 * | 5/2005 | Tseng | 348/374 |
| 2005/0167773 A1 * | 8/2005 | Ozawa et al. | 257/433 |
| 2006/0131477 A1 * | 6/2006 | Lye et al. | 250/208.1 |
| 2007/0001102 A1 * | 1/2007 | Inoguchi | 250/214 R |
| 2007/0131946 A1 | 6/2007 | Spurlock et al. | |
| 2009/0053850 A1 * | 2/2009 | Nishida et al. | 438/64 |

FOREIGN PATENT DOCUMENTS

EP 0 753 893 A2 1/1997

* cited by examiner

*Primary Examiner* — Michael S Lebentritt
(74) *Attorney, Agent, or Firm* — Peyton C. Watkins; Nancy R. Simon

(57) ABSTRACT

A package for an image sensor includes a lead frame having a first surface and a second surface opposite the first surface; an image sensor mounted on the first surface of the lead frame; an optical cover spanning the first surface; and a plastic, optically transparent window in the optical cover and aligned with the image sensor.

16 Claims, 4 Drawing Sheets

PLASTIC IMAGE SENSOR PACKAGING FOR IMAGE SENSORS

FIELD OF THE INVENTION

The present invention generally relates to image sensor packaging and, more particularly, to using plastic for all or a majority of the image sensor packaging.

BACKGROUND OF THE INVENTION

Currently, image sensor packages include an image sensor encapsulated by ceramic packaging. The image sensor collects charge in response to incident light for creating an electronic representation of an image. A window made of glass covers the image sensor for permitting the incident light to be received by the image sensor. The glass is aligned to the substrate, and epoxy is applied and then cured for approximately one hour.

Although the currently known and used packaging is satisfactory, it includes drawbacks. Aligning the glass to a substrate and then curing the epoxy takes approximately one hour. This step would be essentially eliminated by the present invention, and the present invention would also eliminate the need for optical glass, which would ultimately save money. The yield of devices would also increase because many misalignment and cracking of the glass happens during the assembly process. The present invention would also reduce time and provide easy assembly requirements.

It is also noted that the cost of using ceramic packaging is also very expensive because of the material cost and complexity of the process. The present invention eliminates the need for ceramic by substituting less expensive plastic. Plastic is lighter than ceramic and the cost is much lower. Plastic offers a high volume production capability and low manufacturing cost. Plastic packages can be made with very consistent quality since all the packages are derived from the same mold cavity.

SUMMARY OF THE INVENTION

It is an object of the present invention to ease the assembly process, reduce the cost of existing package, and increase the yield of devices.

These and other objects, features, and advantages of the present invention will become apparent to those skilled in the art upon a reading of the following detailed description when taken in conjunction with the drawings wherein there is shown and described an illustrative embodiment of the invention.

ADVANTAGEOUS EFFECT OF THE INVENTION

The present invention has the advantage of reducing the cost of image sensor packaging by using plastic for all or a majority of the image sensor package. Yield is also increased by using plastic over ceramic and the like.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

Figures 1, 2:
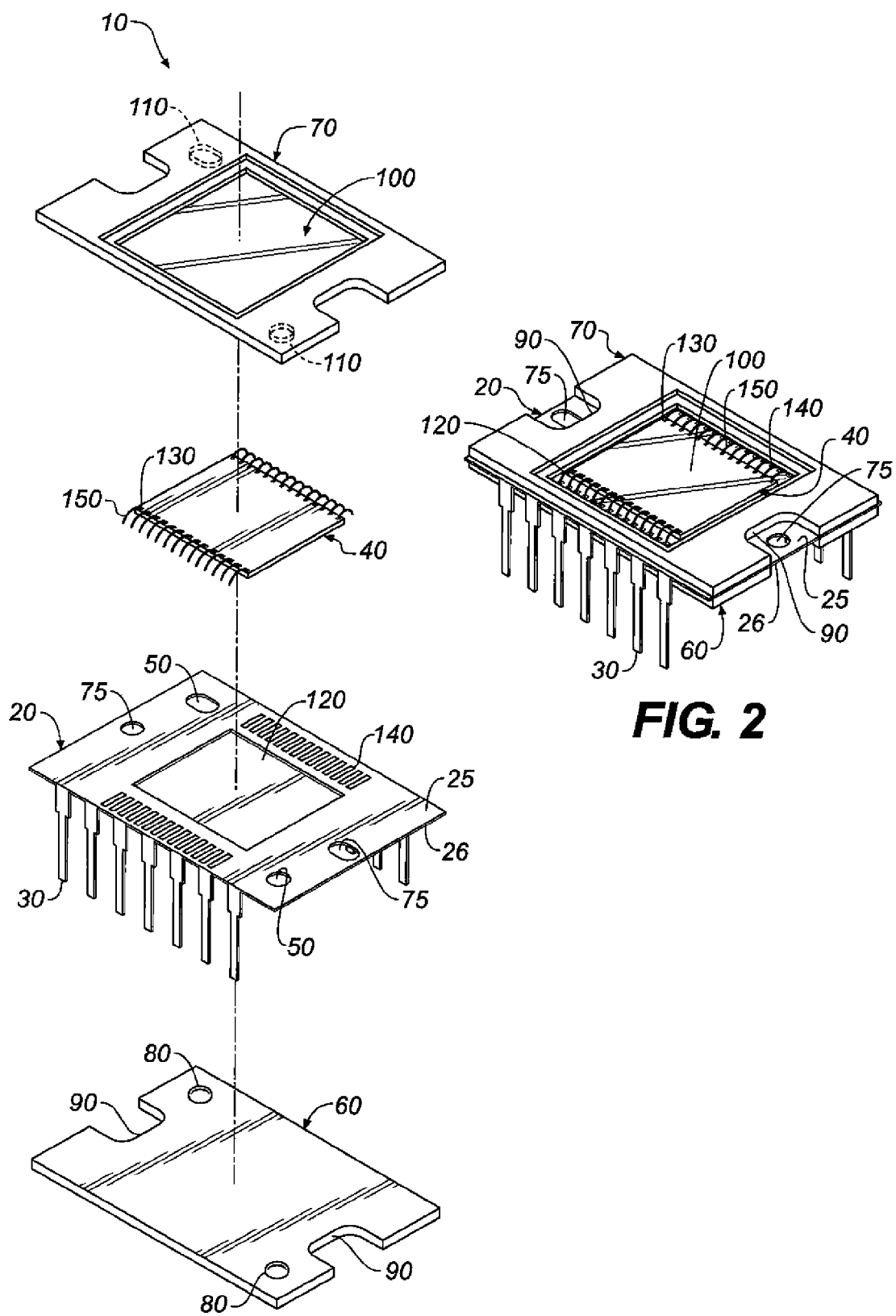
FIG. 1 is a perspective view illustrating assembly of the image sensor package of the present invention.
FIG. 2 is a perspective view of the image sensor as finally assembled.

Turning now to FIGS. 1 and 2, there is shown the image sensor package 10 of the present invention. The image sensor package 10 includes a lead frame 20, preferably made of plastic, having a first surface 25 opposite a second surface 26 (not entirely visible given this perspective view). Although the lead frame is preferably made of entirely plastic or substantially of plastic, the lead frame may alternatively be made of metal. A plurality of leads 30 extends from a peripheral portion of the lead frame for connection to external devices. An image sensor 40 having a plurality of pixels is mounted on the first surface of the lead frame for capturing an electronic representation of an image. The image sensor 40 may be either a charge-coupled device image sensor or a complimentary metal oxide semiconductor (CMOS). The lead frame 20 includes a pair of openings 50 positioned diagonally from each other for assisting in mating a bottom portion 60 and an optical cover 70 to the lead frame 20 as will be discussed in detail hereinbelow. The lead frame 20 also includes a pair of mounting openings 75 for mounting the image sensor package 10 to its intended device, such as a digital camera.

The bottom portion 60 is attached to the second surface 26 of the lead frame 20 and includes a pair of outwardly extending alignment features 80 positioned diagonally or substantially diagonally from each other that are aligned with the openings 50 in the lead frame 20. Two notched-out portions 90 are disposed at each end of the bottom portion 60 to permit access to the mounting openings 75. The bottom portion 60 is also preferably made of entirely of plastic or substantially of plastic.

An optical cover 70 spans at least a portion of the first surface and is attached to the first surface of the lead frame 20 and includes an entirely plastic or substantially plastic, optically transparent window 100 for permitting incident light to be received by the image sensor 40. An outer portion of the optical cover 70 surrounds the plastic, optically transparent window 100 and may also be made of entirely of plastic or substantially of plastic. A pair of depressions 110 is positioned diagonally or substantially diagonally from each other on the surface facing the lead frame 20 and is aligned with the pair of opening 50 in the lead frame and the alignment features 80 of the bottom portion 60. The plastic, optically transparent window 100 or the outer portions of the optical cover 70 may be formed from either acrylic, polystyrene, polycarbonate, polyolefin, lexan or optores or substantially from each of these materials.

When finally packaged, the alignment features 80 respectively pass through the openings 50 in the lead frame 20 and respectively mate with the depressions 110 of the optical cover 70.

The image sensor package 10 is fabricated as follows. An image sensor 40 is mounted onto a central portion 120 of the first surface of the lead frame 20, which is also referred to as the die-attach region. A plurality of bond pads 130 on the image sensor 40 is connected to corresponding finger pads 140 via wire bonds 150. The optical cover 70 is placed on the first surface of the lead frame 20, and the optical cover 70 includes the plastic, optically transparent window 100 that is aligned with the image sensor 40. The bottom portion 60 is placed on the second surface 26 of the lead frame 20, and the optical cover 70 adheres to the bottom portion 60 such that the optical cover 70 and the bottom portion 60 at least partially encapsulate the lead frame 20. The alignment features 80, openings 50 and depressions 110 cooperate to further hold the assembly together as described above.

In one embodiment, the optical cover 70 is placed over the first surface 25 of the lead frame 20 simultaneously with the step of placing the bottom portion 60 over the second surface 26 of the lead frame 20. The optical cover 70 is adhered to the bottom portion 60 by either heat staking, gluing, ultrasonic welding, or ultraviolet (UV) cementing.

Figure 4:
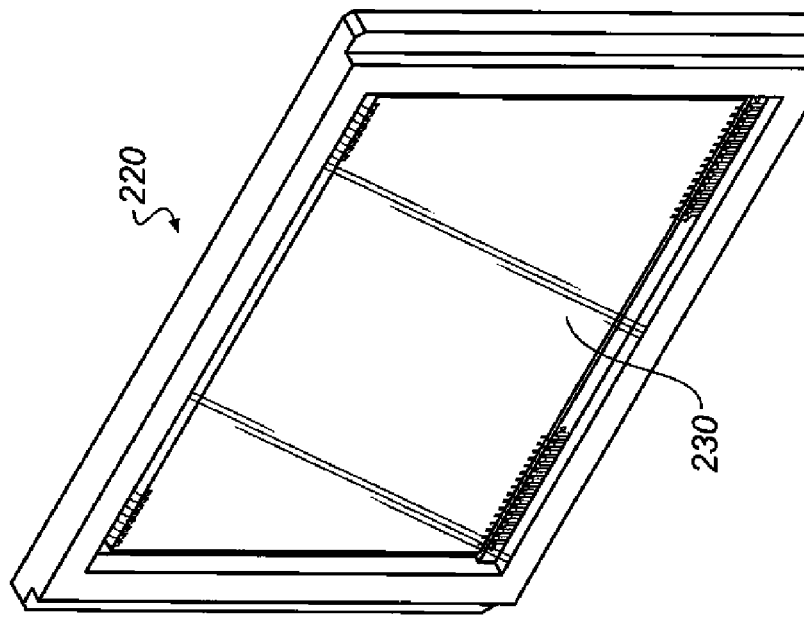
FIG. 4 is a perspective view of the optical cover of the alternative embodiment.
Figure 3:
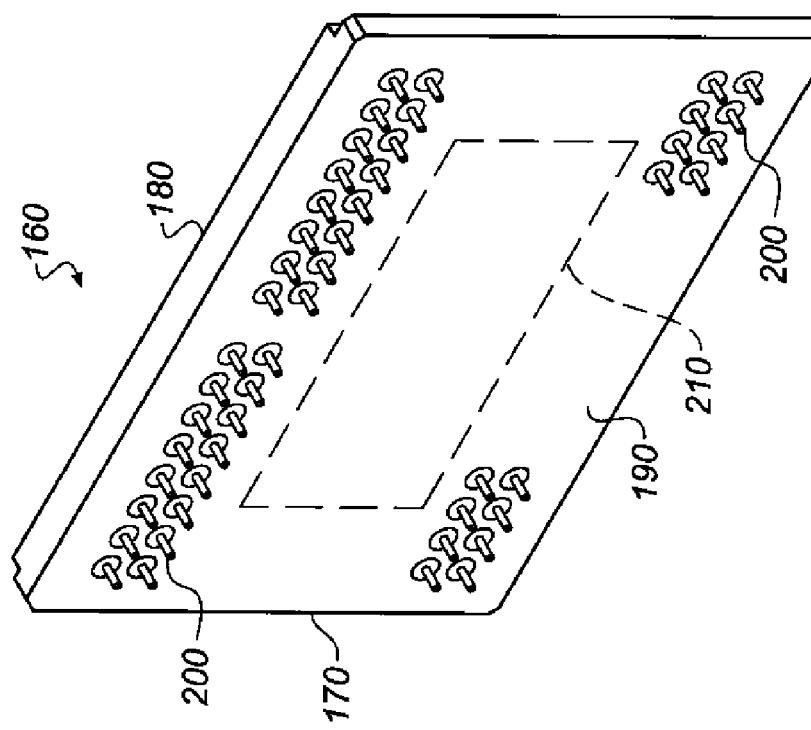
FIG. 3 is a perspective view illustrating assembly of an alternative embodiment of the image sensor package of the present invention.
Figure 5:
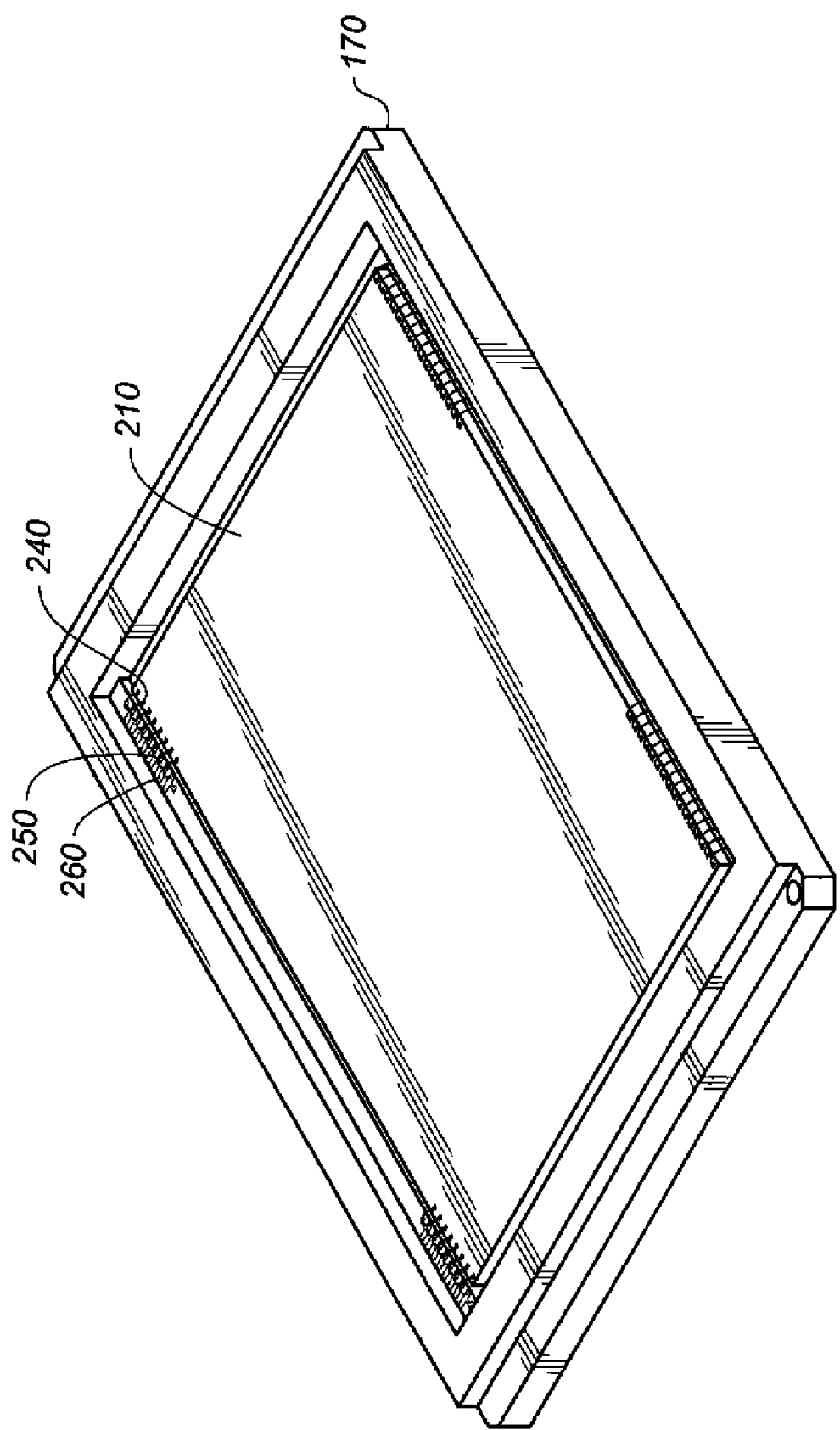
FIG. 5 is a perspective view of the alternative embodiment of the present invention as finally assembled.

Referring to FIGS. 3 and 4, there is shown assembly of an image sensor package 160 commonly referred to in the art as a pinned grid array package. The image sensor package 160 includes a bottom portion 170 having a first surface 180 opposite a second surface 190. A plurality of pins 200, made of metal, is grouped into four separate arrays for connection to external devices. An image sensor 210 is mounted onto the first surface 180 for capturing the electronic representation of an image. An optical cover 220 is placed on the first surface 180 and includes the plastic, optically transparent window 230 on its central portion. The window 230 spans the image sensor 210 to permit incident light to be received by the image sensor 210. Referring to FIG. 5, a plurality of bond pads 240 on the image sensor 210 is connected via bond wires 250 to finger bonds 260. The finger bonds 260 are connected to wires (not shown) which pass through the bottom portion 170 to the plurality of pins 190.

Figure 6:
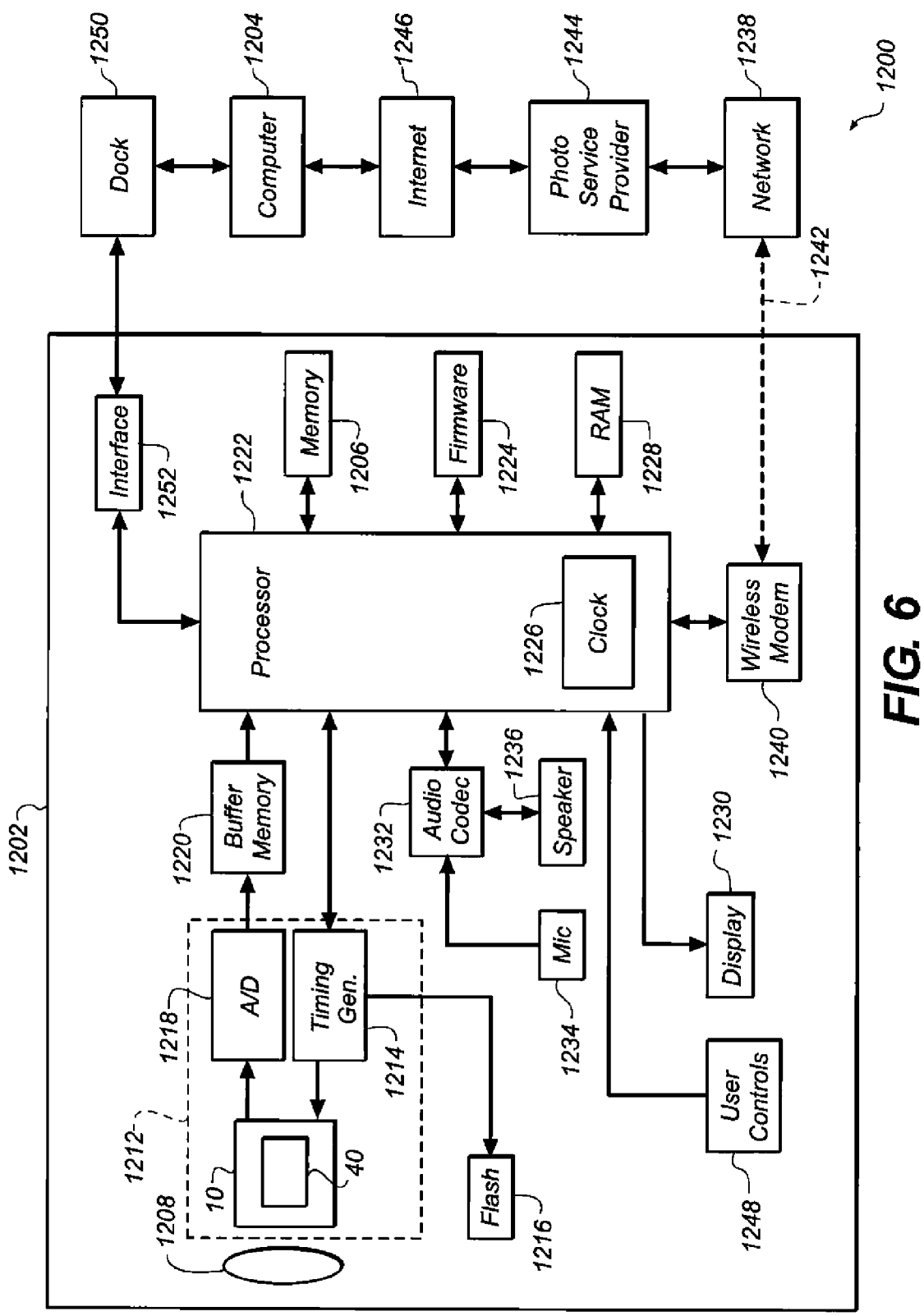
FIG. 6 is a block diagram illustrating an imaging system containing the image sensor packaging of the present invention.

FIG. 6 is a block diagram of an imaging system that can be used with the image sensor package of the present invention. Imaging system 1200 includes digital camera phone 1202 and computing device 1204. Digital camera phone 1202 is an example of an image capture device that can use an image sensor incorporating the present invention. Other types of image capture devices can also be used with the present invention, such as, for example, digital still cameras and digital video camcorders.

Digital camera phone 1202 is a portable, handheld, battery-operated device in an embodiment in accordance with the invention. Digital camera phone 1202 produces digital images that are stored in memory 1206, which can be, for example, an internal Flash EPROM memory or a removable memory card. Other types of digital image storage media, such as magnetic hard drives, magnetic tape, or optical disks, can alternatively be used to implement memory 1206.

Digital camera phone 1202 uses lens 1208 to focus light from a scene (not shown) onto image sensor 40 of the pixel sensor 1212, and the image sensor package 10 contains the image sensor 40. Image sensor 40 provides color image information using the Bayer color filter pattern in an embodiment in accordance with the invention. Image sensor 40 is controlled by timing generator 1214, which also controls flash 1216 in order to illuminate the scene when the ambient illumination is low.

The analog output signals output from the image sensor array 1210 are amplified and converted to digital data by analog-to-digital (A/D) converter circuit 1218. The digital data are stored in buffer memory 1220 and subsequently processed by digital processor 1222. Digital processor 1222 is controlled by the firmware stored in firmware memory 1224, which can be flash EPROM memory. Digital processor 1222 includes real-time clock 1226, which keeps the date and time even when digital camera phone 1202 and digital processor 1222 are in a low power state. The processed digital image files are stored in memory 1206. Memory 1206 can also store other types of data, such as, for example, music files (e.g. MP3 files), ring tones, phone numbers, calendars, and to-do lists.

In one embodiment in accordance with the present invention, digital camera phone 1202 captures still images. Digital processor 1222 performs color interpolation followed by color and tone correction, in order to produce rendered sRGB image data. The rendered sRGB image data are then compressed and stored as an image file in memory 1206. By way of example only, the image data can be compressed pursuant to the JPEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Digital processor 1222 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage Of Full And Reduced Resolution Images" to Kuchta, et al. The thumbnail image is stored in RAM memory 1228 and supplied to color display 1230, which can be, for example, an active matrix LCD or organic light emitting diode (OLED). Generating thumbnail size images allows the captured images to be reviewed quickly on color display 1230.

In another embodiment in accordance with the invention, digital camera phone 1202 also produces and stores video clips. A video clip is produced by summing multiple pixels of image sensor array 1210 together (e.g. summing pixels of the same color within each 4 column×4 row area of the image sensor 40) to create a lower resolution video image frame. The video image frames are read from image sensor 40 at regular intervals, for example, using a 15 frame per second readout rate.

Audio codec 1232 is connected to digital processor 1222 and receives an audio signal from microphone (Mic) 1234. Audio codec 1232 also provides an audio signal to speaker 1236. These components are used both for telephone conversations and to record and playback an audio track, along with a video sequence or still image.

Speaker 1236 is also used to inform the user of an incoming phone call in an embodiment in accordance with the invention. This can be done using a standard ring tone stored in firmware memory 1224, or by using a custom ring-tone downloaded from mobile phone network 1238 and stored in memory 1206. In addition, a vibration device (not shown) can be used to provide a silent (e.g. non-audible) notification of an incoming phone call.

Digital processor 1222 is connected to wireless modem 1240, which enables digital camera phone 1202 to transmit and receive information via radio frequency (RF) channel 1242. Wireless modem 1240 communicates with mobile phone network 1238 using another RF link (not shown), such as a 3GSM network. Mobile phone network 1238 communicates with photo service provider 1244, which stores digital images uploaded from digital camera phone 1202. Other devices, including computing device 1204, access these images via the Internet 1246. Mobile phone network 1238 also connects to a standard telephone network (not shown) in order to provide normal telephone service in an embodiment in accordance with the invention.

A graphical user interface (not shown) is displayed on color display 1230 and controlled by user controls 1248. User controls 1248 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 1250 recharges the batteries (not shown) in digital camera phone 1202. Dock 1250 connects digital camera phone 1202 to computing device 1204 via dock interface 1252. Dock interface 1252 is implemented as wired interface, such as a USB interface, in an embodiment in accordance with the invention. Alternatively, in other embodiments in accordance with the invention, dock interface 1252 is implemented as a wireless interface, such as a Bluetooth or an IEEE 802.11b wireless interface. Dock interface 1252 is used to download images from memory 1206 to computing device 1204. Dock interface 1252 is also used to transfer calendar information from computing device 1204 to memory 1206 in digital camera phone 1202.

The invention has been described in detail with particular reference to certain preferred embodiments thereof, but it will be understood that variations and modifications can be effected within the spirit and scope of the invention.

PARTS LIST 10 image sensor package
20 lead frame
25 first surface
26 second surface
30 leads
40 image sensor
50 openings
60 bottom portion
70 optical cover
75 mounting openings
80 alignment features
90 notched-out portions
100 plastic, optically transparent window
110 depressions
120 die attach region
130 bond pads
140 finger pads
150 wire bonds
160 image sensor package
170 bottom portion
180 first surface
190 second surface
200 pins
210 image sensor
220 optical cover
230 plastic, optically transparent window
240 bond pads
250 bond wires
260 finger bonds
1200 imaging system
1202 digital camera phone
1204 computing device
1206 memory
1208 lens
1210 image sensor array
1212 pixel sensor
1214 timing generator
1216 flash
1218 A/D converter circuit
1220 buffer memory
1222 digital processor
1224 firmware memory
1226 clock
1228 RAM memory
1230 color display
1232 audio codec
1234 microphone
1236 speaker
1238 mobile phone network
1240 wireless modem
1242 RF Channel
1244 photo service provider
1246 Internet
1248 user controls
1250 dock
1252 dock interface

The invention claimed is:

1. A package for an image sensor, comprising:
a lead frame including a first surface and a second surface opposite the first surface and openings through the lead frame;
an image sensor mounted on the first surface of the lead frame;
a bottom plate attached to the second surface of the lead frame, wherein the bottom plate includes first alignment features formed on a surface of the bottom plate that align with the openings in the lead frame;
an optical cover spanning the first surface, wherein the optical cover includes second alignment features formed on a surface of the optical cover that align with the openings in the lead frame and with the first alignment features such that the first and second alignment features mate together; and
a plastic or substantially plastic, optically transparent window in the optical cover and aligned with the image sensor.

2. The package as in claim 1 wherein the bottom plate and the optical cover at least partially encapsulate the lead frame.

3. The package of claim 1, wherein the optical cover and the bottom plate are both formed of a plastic material or substantially a plastic material.

4. The package of claim 3, wherein the plastic, optical window is formed entirely or substantially entirely from either acrylic, polystyrene, polycarbonate, polyolefin, lexan or optores.

5. The package of claim 3, wherein the optical cover is formed entirely or substantially entirely form acrylic, polystyrene, polycarbonate, polyolefin, lexan and optores.

6. An image capture device comprising:
a package for an image sensor, comprising:
a lead frame including a first surface and a second surface opposite the first surface and openings through the lead frame;
an image sensor mounted on the first surface of the lead frame;
a bottom plate attached to the second surface of the lead frame, wherein the bottom plate includes first alignment features formed on a surface of the bottom plate that align with the openings in the lead frame;
an optical cover spanning the first surface, wherein the optical cover includes second alignment features formed on a surface of the optical cover that align with the openings in the lead frame and with the first alignment features such that the first and second alignment features mate together; and a plastic or substantially plastic, optically transparent window in the optical cover and aligned with the image sensor.

7. The image capture device as in claim 6 wherein the bottom plate and the optical cover at least partially encapsulate the lead frame.

8. The image capture device as in claim 6, wherein the optical cover and the bottom plate are both formed of a plastic material or substantially a plastic material.

9. The image capture device as in claim 8, wherein the plastic, optical window is formed from entirely or substantially entirely either acrylic, polystyrene, polycarbonate, polyolefin, lexan or optores.

10. The image capture device as in claim 8, wherein the optical cover is formed entirely or substantially entirely form acrylic, polystyrene, polycarbonate, polyolefin, lexan or optores.

11. The image sensor as in claim 1, wherein the openings in the lead frame are positioned substantially diagonally from each other, the first alignment features comprise outwardly extending alignment features, and the second alignment features comprise depressions.

12. The image sensor as in claim 1, wherein the bottom plate and lead frame are integrally formed.

13. The image sensor as in claim 1, wherein the lead frame further includes mounting openings through the lead frame and the bottom plate includes notched-out portions that permit access to the mounting openings in the lead frame.

14. The image capture device as in claim 6, wherein the openings in the lead frame are positioned substantially diagonally from each other, the first alignment features comprise outwardly extending alignment features, and the second alignment features comprise depressions.

15. The image capture device as in claim 6, wherein the bottom plate and lead frame are integrally formed.

16. The image capture device as in claim 6, wherein the lead frame further includes mounting openings through the lead frame and the bottom plate includes notched-out portions that permit access to the mounting openings in the lead frame.

* * * * *